(12) United States Patent
Kim

(10) Patent No.: US 12,150,286 B2
(45) Date of Patent: Nov. 19, 2024

(54) POWER INVERTER WITH EXTRUSION COOLER WITH FLOW HOLES

(71) Applicants: Hyundai Motor Company, Seoul (KR); Kia Corporation, Seoul (KR)

(72) Inventor: Yoon Ho Kim, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 119 days.

(21) Appl. No.: 17/496,494

(22) Filed: Oct. 7, 2021

(65) Prior Publication Data

US 2022/0346286 A1 Oct. 27, 2022

(30) Foreign Application Priority Data

Apr. 22, 2021 (KR) ........................ 10-2021-0052484

(51) Int. Cl.
*H05K 7/20* (2006.01)
*H02M 7/00* (2006.01)
*H02P 27/06* (2006.01)

(52) U.S. Cl.
CPC ........ *H05K 7/20927* (2013.01); *H02M 7/003* (2013.01); *H02P 27/06* (2013.01)

(58) Field of Classification Search
CPC ... H05K 7/20; F28D 15/00; F28D 2021/0028; F28D 1/0366; F28D 9/0062;
(Continued)

(56) References Cited

U.S. PATENT DOCUMENTS 8,416,574 B2 * 4/2013 Tokuyama ........... H05K 1/0262
165/80.4
9,439,324 B2 * 9/2016 Ishibashi ............ H05K 7/20254
(Continued)

FOREIGN PATENT DOCUMENTS

EP 2744316 A2 * 6/2014 ........... H01L 23/473
JP 2018126000 A * 8/2018 ............ H02M 7/003
(Continued)

OTHER PUBLICATIONS

Machine translation completed Jun. 1, 2023, JP 7079625 by Genta et al. (Year: 2023).*

*Primary Examiner* — Zachary Pape
*Assistant Examiner* — Steven Ngo
(74) *Attorney, Agent, or Firm* — Morgan, Lewis & Bockius LLP

(57) ABSTRACT

A power inverter may include a housing including an arrangement space having a capacitor, a pair of cooling spaces formed on opposite sides of the arrangement space and include first and second cooling spaces, a cooling passage communicating first ends of the pair of cooling spaces with each other, and a pair of through holes respectively fluidically-connecting second ends of the pair of cooling spaces to outside of the power inverter apparatus; a first cooling plate coupled to the first cooling space to seal the first cooling space thereby; a second cooling plate coupled to the second cooling space and provided with a pair of flow holes; a first power module contacting with the first cooling plate; a second power module contacting with the second cooling plate; an extrusion cooler contacting with the second power module; and a third power module contacting with the extrusion cooler.

15 Claims, 4 Drawing Sheets

(58) Field of Classification Search
CPC ............. B60R 16/0231; B60L 2210/42; B60L 2210/10; B60L 50/51; B60L 2210/44; B60L 1/003; B60L 58/33; B60L 3/003; F01P 2050/24; F01P 3/12; F01P 3/20
See application file for complete search history.

(56) References Cited

U.S. PATENT DOCUMENTS

| | | | | |
|---|---|---|---|---|
| 10,403,561 | B2* | 9/2019 | Yoshihara | B60K 11/02 |
| 10,497,506 | B2* | 12/2019 | Massolini | H01F 41/04 |
| 10,615,708 | B2* | 4/2020 | Iwagami | H02M 7/53871 |
| 10,765,042 | B1* | 9/2020 | Wang | H02M 7/003 |
| 10,916,931 | B2* | 2/2021 | Reiter | G05B 15/02 |
| 11,191,192 | B2* | 11/2021 | Takeuchi | H01L 23/4012 |
| 2008/0117602 | A1* | 5/2008 | Korich | H01G 11/82 |
| | | | | 361/715 |
| 2013/0039009 | A1* | 2/2013 | Shin | B60K 6/22 |
| | | | | 361/699 |
| 2019/0123659 | A1* | 4/2019 | Okubo | H02M 7/003 |
| 2019/0296677 | A1* | 9/2019 | Oka | H02P 21/20 |
| 2019/0393132 | A1* | 12/2019 | Tamura | H01L 23/473 |
| 2020/0068748 | A1* | 2/2020 | Hoskins | H05K 7/20254 |
| 2020/0068749 | A1* | 2/2020 | Ono | H05K 7/20927 |

FOREIGN PATENT DOCUMENTS

| | | | | | |
|---|---|---|---|---|---|
| JP | 2019193523 | A | * | 10/2019 | ......... H01L 23/4012 |
| JP | 6641463 | B2 | * | 2/2020 | ............ H01L 23/44 |
| JP | 2020025430 | A | * | 2/2020 | ............ H02M 7/003 |
| JP | 7079625 | B2 | * | 6/2022 | ............. H02M 1/00 |
| JP | 7206624 | B2 | * | 1/2023 | ............ H02K 11/33 |
| KR | 10-2005-0082494 | A | | 8/2005 | |
| WO | WO-2013015105 | A1 | * | 1/2013 | ......... B60L 11/1812 |
| WO | WO-2013046954 | A1 | * | 4/2013 | ............ B60L 1/003 |
| WO | WO-2013065472 | A1 | * | 5/2013 | ............ H02M 7/003 |
| WO | WO-2013140502 | A1 | * | 9/2013 | ............ B60L 15/007 |
| WO | WO-2013145881 | A1 | * | 10/2013 | ......... H01L 21/4878 |
| WO | WO-2015025594 | A1 | * | 2/2015 | ......... H01L 23/473 |
| WO | WO-2016121445 | A1 | * | 8/2016 | ............ H02M 7/003 |
| WO | WO-2017094370 | A1 | * | 6/2017 | ............ B60K 1/00 |
| WO | WO-2017187781 | A1 | * | 11/2017 | ............ H01L 23/44 |

* cited by examiner

FIG. 4

| category | CEW mode | OEW mode |
|---|---|---|
| first power module | Total: 3600W | Total: 3600W |
| second power module | Total: 0W | Total: 5400W |
| third power module | Total: 1440W | Total: 0W |
| Total | 5040W | 9000W |

POWER INVERTER WITH EXTRUSION COOLER WITH FLOW HOLES

CROSS REFERENCE TO RELATED APPLICATION

The present application claims priority to Korean Patent Application No. 10-2021-0052484, filed Apr. 22, 2021, the entire contents of which is incorporated herein for all purposes by this reference.

BACKGROUND OF THE INVENTION

Field of the Invention

The present invention relates to a power inverter for a vehicle, and more particularly, to a power inverter in which a plurality of power modules for providing power required for driving a motor to the motor is mounted.

Description of Related Art

To drive a multi-phase motor of an electric vehicle, an inverter provided with a plurality of switching elements is required.

In general, the inverter is provided with the plurality of switching elements including a pair of switching elements each corresponding to a plurality of phases. For example, in a case of a three-phase motor, a pair of switching elements is applied to each phase, so that a total of six switching elements may be applied. The two switching elements corresponding to each phase are turned on/off to have a mutually complementary relationship when driving a motor, and the entire switching element is controlled to be turned on/off by a pulse-width modulation method, so that the power required to drive the motor is provided to the motor.

In general, one inverter circuit is often applied to drive a motor, but a method using two inverters is known, wherein the inverters are respectively applied to opposite end portions of motor coils to improve motor power and driving efficiency.

When one inverter is applied, a neutral point at which first end portions of the motor coils are short-circuited with each other is formed, so that the method of driving a motor by use of one inverter is called a closed-end winding method. Whereas, in the method of using two inverters, since two inverters are respectively connected to the opposite end portions of the motor coils, the first end portions of the motor coils are not short-circuited with each other, so the present method is called an open-end winding method.

Meanwhile, a method similar to the open-end winding method is also known, wherein inverters are respectively applied to the opposite end portions of the motor coils, additional switching elements for facilitating the first end portions of the motor coils to be shorted/opened with each other are provided, and the first end portions of the motor coils are selectively shorted/opened with each other, to selectively apply the closed-end winding method and the open-end winding method, driving a motor.

In the instant case, a plurality of switching elements, such as a switching element for realizing each inverter and a switching element for selecting an operation method, is required, so it is necessary to implement a motor driving device by efficiently modularizing the plurality of switching elements in consideration of cooling performance and the like.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to efficiently cooling a power inverter provided with a plurality of power modules.

A power inverter according to various exemplary embodiments of the present invention may include a housing including an arrangement space in which a capacitor is disposed in a center portion thereof, a pair of cooling spaces formed on opposite sides of the arrangement space to be separated from the arrangement space and allow a refrigerant to flow therein, and include a first cooling space and a second cooling space, a cooling passage separated from the arrangement space and fluidically communicating first ends of the pair of cooling spaces with each other, and a pair of through holes respectively fluidically-connecting second ends of the pair of cooling spaces to outside of the power inverter apparatus; a first cooling plate coupled to the first cooling space to seal the first cooling space thereby; a second cooling plate coupled to the second cooling space and provided with a pair of flow holes at opposite ends thereof through which the refrigerant flows to the outside or inside of the second cooling space; a first power module contacting with an external side of the first cooling plate; a second power module contacting with an external side of the second cooling plate; an extrusion cooler mounted to contact with an external side of the second power module, the extrusion cooler having opposite end portions thereof connected to a pair of flow holes, allowing the refrigerant to flow in from the second cooling space through one of the pair of flow holes, and allowing the refrigerant to flow into the second cooling space through a remaining one of the pair of flow holes; and a third power module mounted to contact with an external side of the extrusion cooler.

The through holes may include: an inlet hole fluidically connected to the first cooling space through which the refrigerant flows in; and an outlet hole connected to the second cooling space through which the refrigerant flows out.

In the extrusion cooler, a part of the refrigerant in the second cooling space may flow by a pressure difference between the extrusion cooler and the second cooling space.

The first cooling plate and the second cooling plate may respectively include cooling fins respectively extending toward the pair of cooling spaces.

A flow rate ratio of the second cooling space and the extrusion cooler may be set through a volume size of the cooling fins of the second cooling plate.

The power inverter may further include: a nipple connected to each of the through holes to allow the refrigerant to flow in from the outside thereof or flow out to the outside.

The power inverter may further include: a control board disposed on an upper portion of the housing and connected to the first power module, the second power module, and the third power module, to control operation of the first, second and third power modules.

The first power module may be always operated to generate a constant amount of heat, and operations of the second power module and the third power module may be controlled by the control board depending on a power inversion state, so that an amount of heat generated thereby is changed.

The housing may include an extension portion extending upwards from an upper surface of the housing and connected to the circuit board, and may further include a guide coupling the control board to the housing and insulating the control board.

The power inverter may further include: a pair of brackets respectively positioned between the first power module and the first cooling plate and between the second power module and the second cooling plate and coupling the first power module and the second power module to the housing.

The power inverter may further include: a first busbar coupled to an external side of the first power module to connect an external motor and the first power module to each other; and a current sensor connected to the first busbar to measure a current that flows to the external motor.

The power inverter may further include: a second busbar provided at a lower portion of the housing, connected to the second power module, and connecting the second power module to an external motor.

The power inverter may further include: a pair of thermal pads respectively positioned at an external side of the first power module and an external side of the third power module to radiate heat from the first power module and the third power module; and a pair of module covers respectively positioned at an external side of the thermal pads to cover the thermal pads, the first power module, the second power module, and the third power module.

The present invention has an effect that a first cooling space and second cooling space in which a refrigerant flows are formed on opposite sides of an arrangement space where a capacitor according to various exemplary embodiments of the present invention is mounted, a cooling passage is provided which is separated from the arrangement space and connects the first cooling space and the second cooling space to each other, a first cooling plate and second cooling plate for respectively sealing the first cooling space and second cooling space are provided on opposite sides of the arrangement space, a first power module and second power module are respectively surface-attached to the first cooling plate and second cooling plate on the opposite sides of the arrangement space, an extrusion cooler is provided which is surface-attached to an external side of the second power module and is connected to the second cooling space to allow the refrigerant to flow, and as the third power module is surface-attached to an external side of the extrusion cooler, the components of the capacitor, the first power module, the second power module, and the third power module may be simultaneously cooled through one cycle of refrigerant circulation.

Furthermore, the present invention has an effect that as the first power module is always operated and the second power module and the third power module are temporarily operated under control of a control board, the refrigerant flows into the first cooling space to firstly cool the first power module, and the refrigerant flows into the second cooling space and the extrusion cooler through the cooling passage, increasing the cooling efficiency.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 4 is a view showing amounts of power of the first power module, the second power module, and the third power module, according to a control mode.

Figure 1:
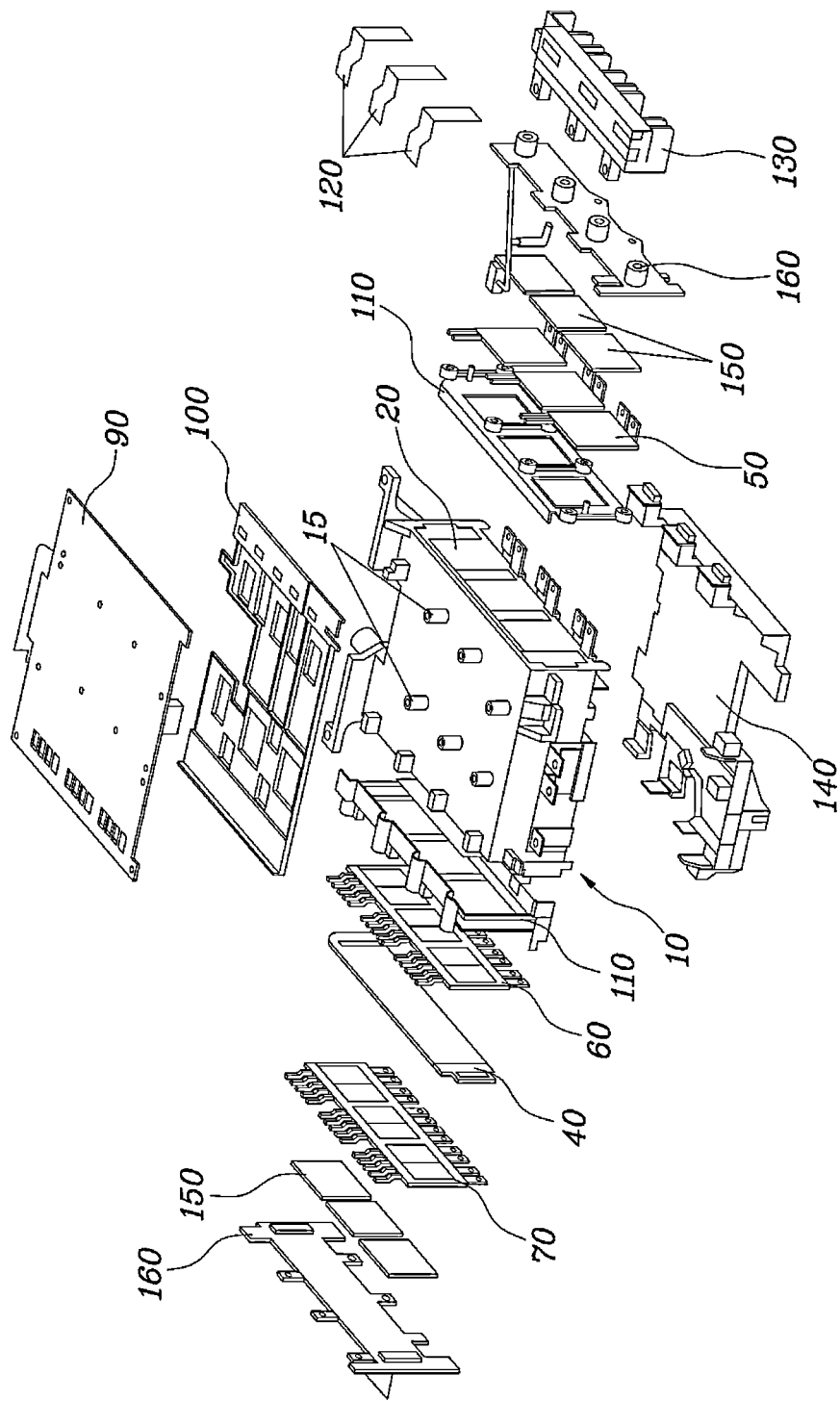
FIG. 1 is a perspective view showing a power inverter according to various exemplary embodiments of the present invention.

It may be understood that the appended drawings are not necessarily to scale, presenting a somewhat simplified representation of various features illustrative of the basic principles of the present invention. The specific design features of the present invention as disclosed herein, including, for example, specific dimensions, orientations, locations, and shapes will be determined in part by the particular intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Specific structural and functional descriptions of the embodiments of the present invention disclosed herein are only for illustrative purposes of the embodiments of the present invention. The present invention may be embodied in many different forms. Therefore, the embodiments of the present invention should not be construed as limiting the present invention.

Since the embodiments of the present invention can be variously modified in many different forms, specific embodiments will be illustrated in the drawings and described in detail in the specification or application of the present invention. However, this is not intended to limit the embodiments in accordance with the concept of the present invention to a particular disclosed form. On the contrary, the present invention is to be understood to include all various alternatives, equivalents, and substitutes that may be included within the spirit and scope of the present invention.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It will be understood that when an element is referred to as being "coupled" or "coupled" to another element, it can be directly coupled or connected to the other element or intervening elements may be present. In contrast, it should be understood that when an element is referred to as being "directly coupled" or "directly connected" to another element, there are no intervening elements present. Other expressions that explain the relationship between elements, such as "between", "directly between", "adjacent to", or "directly adjacent to" should be construed in the same way.

The terminology used herein is for describing various exemplary embodiments only and is not intended to be limiting. As used herein, the singular forms are intended to include the plural forms as well, unless the context clearly indicates otherwise. It will be further understood that the terms "comprise", "include", "have", etc. when used in the exemplary embodiment, specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present invention, and will not be interpreted in an idealized or overly formal sense unless expressly so defined herein.

Hereinafter, various exemplary embodiments of the present invention will be described in detail with reference to the accompanying drawings. Throughout the drawings, the same reference numerals will refer to the same or like portions.

Figure 2:
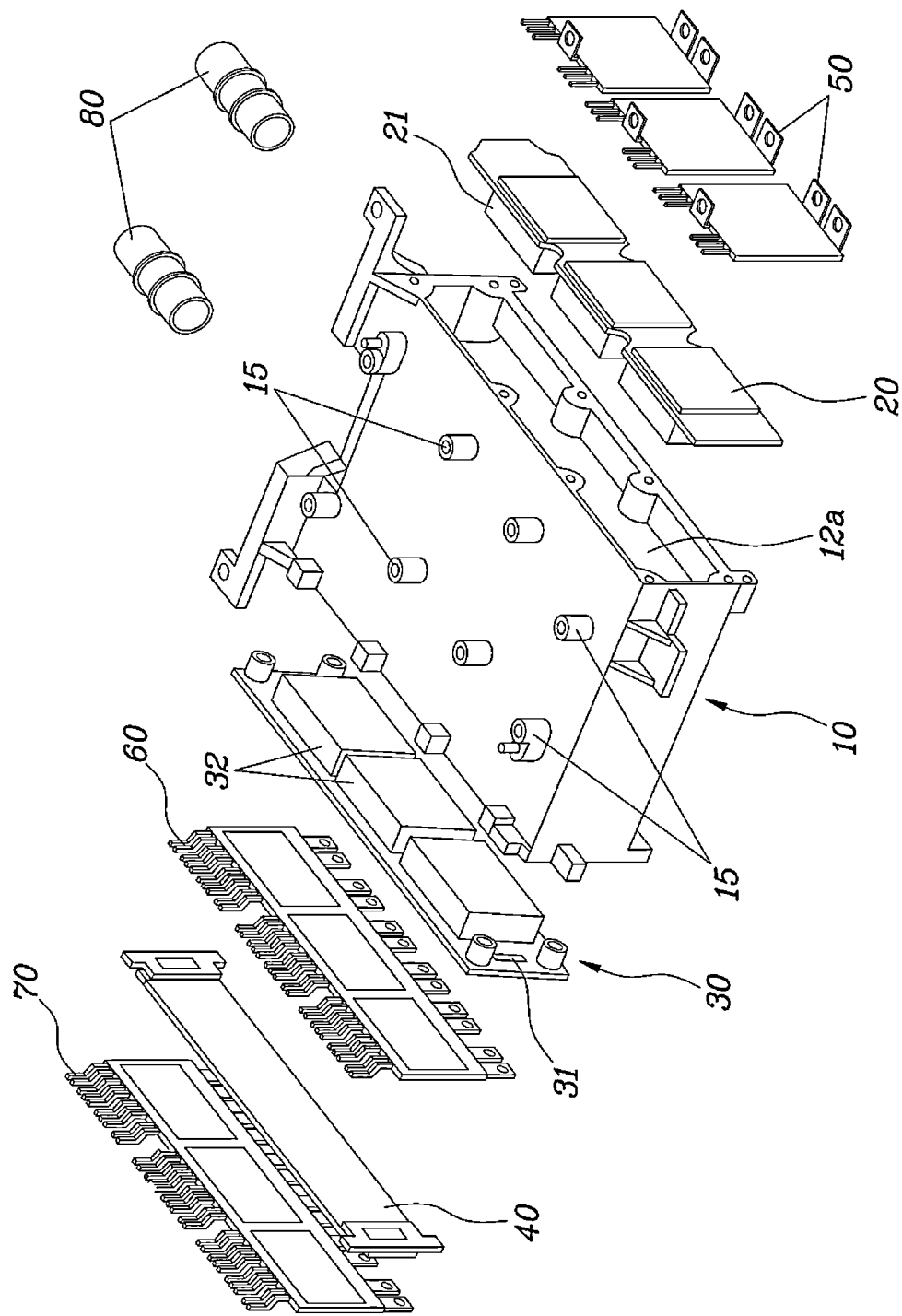
FIG. 2 is a perspective view showing a housing, a first power module, a second power module, a third power module, a first cooling plate, a second cooling plate, and an extrusion cooler according to the exemplary embodiment of the present invention.
Figure 3:
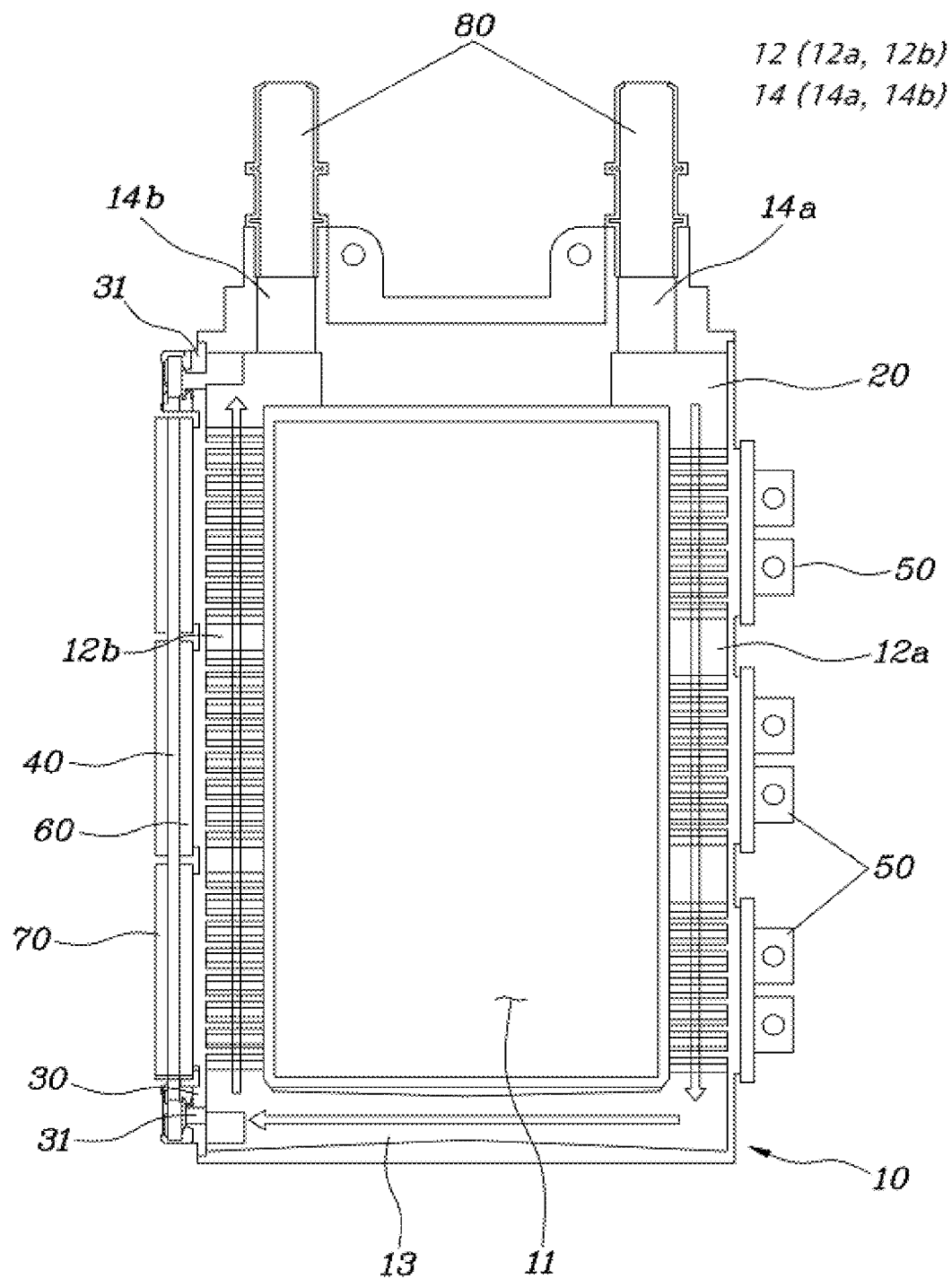
FIG. 3 is a cross-sectional view of FIG. 2.

FIG. 1 is a perspective view showing a power inverter according to various exemplary embodiments of the present invention. FIG. 2 is a perspective view showing a housing 10, a first power module 50, a second power module 60, a third power module 70, a first cooling plate 20, a second cooling plate 30, and an extrusion cooler 40 according to the exemplary embodiment of the present invention. FIG. 3 is a cross-sectional view of FIG. 2. FIG. 4 is a view showing amounts of power of the first power module 50, the second power module 60, and the third power module 70, according to a control mode.

Referring to FIG. 1, FIG. 2, FIG. 3, and FIG. 4, an exemplary embodiment of the power inverter according to various exemplary embodiments of the present invention will be described as follows.

The power inverter according to various exemplary embodiments of the present invention may include a housing 10 including an arrangement space 11 in which a capacitor is arranged in a center thereof; a pair of cooling spaces 12 formed on opposite sides of the arrangement space 11 to be separated from the arrangement space 11 and allow a refrigerant to flow therein, and configured to include a first cooling space 12a and a second cooling space 12b, a cooling passage 13 separated from the arrangement space 11 and configured to communicate first ends of the pair of cooling spaces 12a and 12b with each other, and a pair of through holes 14 connecting second ends of the pair of cooling spaces 12a and 12b to outside; a first cooling plate 20 coupled to the first cooling space 12a to seal the first cooling space 12a; a second cooling plate 30 coupled to the second cooling space 12b and provided with a pair of flow holes 31 formed at opposite ends through which the refrigerant flows to outside or inside of the second cooling space 12b; a first power module 50 contacting with an external side of the first cooling plate 20; a second power module 60 contacting with an external side of the second cooling plate 30; an extrusion cooler 40 contacting with an external side of the second power module 60, the extrusion cooler 40 having opposite end portions thereof connected to the pair of flow holes 31, allowing the refrigerant to flow in from the second cooling space 12b through any one of the pair of flow holes 31, and allowing the refrigerant to flow into the second cooling space 12b through the other of the pair of flow holes; and a third power module 70 contacting with an external side of the extrusion cooler 40.

The arrangement space 11 in which a capacitor is arranged is formed inside the housing 10, cooling spaces 12a and 12b in which the refrigerant flows are respectively formed on opposite sides of the arrangement space 11, and opposite sides of the pair of cooling spaces 12 are formed to be open.

The first cooling plate 20 may be coupled to the housing 10 to seal the first cooling space 12a, and the second cooling plate 30 may be coupled to the housing 10 to seal the second cooling space 12b.

The first power module 50 connected to a motor and configured to control the current applied to the motor may be coupled to the external side of the first cooling plate 20, and the second power module 60 connected to the motor and configured to control the current applied to the motor may be coupled to the external side of the second cooling plate 30.

Furthermore, the pair of flow holes 31 through which the refrigerant may flow is respectively formed at opposite end portions of the second cooling plate 30, the extrusion cooler 40 has opposite end portions thereof respectively connected to the pair of flow holes 31 and may be surface-attached to and arranged on an external side of the second power module 60, and also the third power module 70 may be mounted on the external side of the extrusion cooler 40.

In the present way, a part of the refrigerant introduced into the second cooling space 12b flows out into one of the flow holes 31 of the pair of flow holes 31 and flows into the extrusion cooler 40, cooling the second power module 60 and the third power module 70. Thereafter, the refrigerant may flow into the other flow hole 31 of the pair of flow holes 31, so that the refrigerant inside the extrusion cooler 40 may flow into the second cooling space 12b.

The flow hole 31 through which the refrigerant flows out from the second cooling space 12b may be positioned adjacent to the cooling passage 13, and the flow hole 31 through which the refrigerant flows into the second cooling space 12b may be positioned adjacent to the through hele one of the pairs of through holes 14 connected to the second cooling space 12b.

A pair of through holes 14 through which the refrigerant flows in from the outside or flow out to the outside may be formed in each cooling space 12. Furthermore, a cooling passage 13 may be formed on an opposite side of the through hole 14, the cooling passage 13 being separated from the arrangement space 11 and communicating the pair of cooling spaces 12 on opposite sides of the arrangement space 11 with each other so that the refrigerant may flow.

In the present way, the refrigerant introduced through the through hole 14 connected to the first cooling space 12a passes through the first cooling space 12a, the cooling passage 13, the second cooling space 12b, and the extrusion cooler 40 and flows out into the through hole 14 of the second cooling space 12b, so that there is an effect that the first power module 50, the second power module 60, and the third power module 70 may all be cooled through one cycle of refrigerant circulation.

The through hole 14 may include: an inlet hole 14a connected to the cooling space 12 in which the first cooling plate 20 is positioned and through which the refrigerant flows in; and an outlet hole 14b connected to the cooling space 12 in which the second cooling plate 30 is positioned and through which the refrigerant flows out.

The inlet hole 14a is connected to the first cooling space 12a to which the first cooling plate 20 is coupled, so that a refrigerant is injected from the outside, passes through the cooling passage 13 from the first cooling space 12a, and flows into the second cooling space 12b.

A part of the refrigerant flowing into the second cooling space 12b flows into the extrusion cooler 40 through any one flow hole 31 of the pair of flow holes 31, flows out from the extrusion cooler 40 through the other flow hole 31 of the pair of flow holes 31, so that through the outlet hole 14b, the refrigerant may flow to the outside together with the refrigerant in the second cooling space 12b.

In the present way, in one cycle of refrigerant circulation, all of the first power module 50, the second power module 60, and the third power module 70 may be cooled.

In the extrusion cooler 40, a part of the refrigerant in the second cooling space 12b may flow by a pressure difference between the extrusion cooler 40 and the second cooling space 12b.

Due to the difference in volume between the extrusion cooler 40 and the second cooling space 12b to which the second cooling plate 30 is coupled, the pressure difference between the second cooling space 12b and the extrusion cooler 40 is generated, and due to the pressure difference between the cooling space 12 and the extrusion cooler 40, the flow rate of the refrigerant flowing into the second cooling space 12b and the extrusion cooler 40 may be determined.

The flow rate of the refrigerant flowing into the second cooling space 12b and the extrusion cooler 40 may be determined according to an amount of heat of the second power module 60 and the third power module 70, and accordingly, the volume inside the extrusion cooler 40 may be determined.

In the present way, there is an effect of effectively cooling the second power module 60 and the third power module 70 by controlling the flow rate between the second cooling space 12b and the extrusion cooler 40.

The first cooling plate 20 and the second cooling plate 30 may respectively include cooling fins 21 and 32, which extend toward the cooling space 12.

The cooling fins 21 and 32 are respectively extended from the internal surfaces of the first cooling plate 20 and the second cooling plate 30 into the cooling space 12, and may contact with the refrigerant. The cooling fins 21 and 32 may be formed in plurality, and the plurality of cooling fins 21 and 32 may contact with the refrigerant to exchange heat.

The volume of the cooling fins 21 and 32 may be set in consideration of the flow rate of the refrigerant.

The flow rate ratio of the second cooling space 12b and the extrusion cooler 40 may be set through a volume size of the cooling fins 32 of the second cooling plate 30.

The volume of the cooling fins 32 of the second cooling plate 30 coupled to the second cooling space 12b may set a volume in which the refrigerant is able to flow in the second cooling space 12b.

By setting the volume inside the second cooling space 12b and using the volume of the cooling fins 32, the flow rate of the refrigerant flowing inside the extrusion cooler 40 and the second cooling space 12b is set, whereby a cooling amount of the second power module 60 and the third power module 70 may be set.

The present invention may further include: a nipple 80 connected to the through hole 14 to allow the refrigerant to flow in from the outside thereof or flow out to the outside.

The nipple 80 having a hollow tube form may be inserted into and coupled to the through hole 14, and the nipple 80 is connected to the outside so that the refrigerant may flow in from the outside thereof or out to the outside.

A compressor for facilitating a refrigerant to flow may be provided outside, the compressor enables the refrigerant to flow through a hollow tube such as a hose, and the hose is connected to the nipple 80 so that the refrigerant may flow into the housing 10. The hose and the nipple 80 are in close contact with each other to prevent the refrigerant from leaking out of the housing 10.

The present invention may further include: a control board 90 disposed on the housing 10 and connected to the first power module 50, the second power module 60, and the third power module 70 to control operation thereof.

The control board 90 is disposed on a position in an upper direction of the housing 10, may be connected to the first power module 50, the second power module 60, and the third power module 70, and may control the current input to a motor from the first power module 50, the second power module 60, and the third power module 70.

The first power module 50 is always operated to generate a constant amount of heat, and the operations of the second power module 60 and the third power module 70 are controlled by the control board 90 depending on power inversion states, so that the amount of heat may be changed.

In the power inverter according to various exemplary embodiments of the present invention, since a neutral point in which first end portions of the motor coils using one inverter are short-circuited with each other is formed according to the control of the control board 90, the power inverter may be controlled by the methods including: a closed-end winding method, which is a method of driving a motor using one inverter; and an open-end winding method, which is a method of using two inverters and in which the first end portions of the motor coils are not short-circuited with each other because the inverters are respectively connected to the opposite end portions of the motor coil.

When controlling in the closed-end winding (CEW) method, the first power module 50 is used and the third power module 70 for switching may be used as a power module for switching, and when controlling in the open-end winding (OEW) method, the first power module 50 and the second power module 60 are used.

As described above, the first power module 50 and the third power module 70 are used for the closed-end winding method, the first power module 50 is used as a main power module, and the third power module 70 is used as the power module for switching, generating a small amount of heat.

Furthermore, in the first power module 50 and the second power module 60, as two power modules are used in the open-end winding (OEW) method, the first power module 50 and the second power module 60 generate a high amount of heat.

Since the first power module 50 is used for the open-end winding method and the closed-end winding method and always operated, a lot of cooling is required, so that the refrigerant is first cooled, and then the second power module 60 and the third power module 70 are cooled.

In the present way, there is an effect that the cooling efficiency may be increased by one cycle of refrigerant circulation.

The housing 10 includes an extension portion 15 extending upwards from an upper surface thereof and connected to a circuit board, and may further include a guide 100 for coupling the control board 90 to the housing 10 and insulating the control board 90.

The control board 90 is disposed at a position in the upper direction of the housing 10, and a guide 100 for coupling the control board 90 to the housing 10 may couple the control board 90 to the housing 10 between the control board 90 and the housing 10. Furthermore, the guide 100 may insulate the lower portion of the control board 90 to prevent malfunction of the control board 90.

Furthermore, the extension portion 15 extending upwards from the upper surface of the housing 10 is formed so that the extension portion 15 and the guide 100 are coupled to each other, fixing the guide 100 and the control board 90.

The present invention may further include: a pair of brackets 110 respectively positioned between the first power module 50 and the first cooling plate 20 and between the second power module 60 and the second cooling plate 30, and configured to couple the first power module 50 and the second power module 60 to the housing 10.

A pair of brackets 110 are positioned at opposite sides of the housing 10 in the first direction to fix the first power module 50 and the second power module 60, and the first power module 50 and the second power module 60 are respectively surface-attached to the first cooling plate 20 and the second cooling plate 30, to be cooled.

In the present way, even when an external shock or vibration is generated, the first power module 50 and the second power module 60 may not be separated.

The present invention may further include: a first busbar 120 coupled to an external side of the first power module 50 to connect an external motor and the first power module 50 to each other; and a current sensor 130 connected to the first busbar 120 to measure a current that flows to the motor.

On the external side of the first power module 50, the first busbar 120 connecting the first power module 50 and the motor to each other is provided to input AC voltage, which is converted by a capacitor, to an external motor through the power module, and in the first power module 50, the intensity of the current is controlled through the control board 90.

In the instant case, the current sensor 130 may measure the current input from the power module to the motor, to check whether the power module malfunctions.

The present invention may further include: a second busbar 140 provided at a lower portion of the housing 10 and connected to the second power module 60 to connect the second power module 60 to an external motor.

The second busbar 140 for connecting the second power module 60 to the external motor is provided for the operation of the open-end winding method, and in the second power module 60, the intensity of the current is controlled through the control board 90.

The second busbar 140 is positioned at the lower portion of the housing 10 at a position different from that of the first busbar 120, and may be connected to the external motor.

The present invention may further include: a pair of thermal pads 150 respectively positioned at an external side of the first power module 50 and an external side of the third power module 70 to radiate heat from the first power module 50 and the third power module 70; and a pair of module covers 160 positioned at an external side of the thermal pads 150 to cover the thermal pad 150, the first power module 50, the second power module 60, and the third power module 70.

The thermal pads 150 are respectively positioned on an external surface of the first power module 50 and an external surface of the third power module 70, the external surfaces not being in contact with a cooling device, to be able to assist heat dissipation of the first power module 50 and the third power module 70.

Furthermore, at a position on an external side of the thermal pad 150, a module cover 160 for covering the first power module 50, the second power module 60, the third power module 70, and the extrusion cooler 40 may be disposed to protect same from the external foreign matter or impact.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A power inverter apparatus comprising:
a housing including:
an arrangement space in which a capacitor is arranged in a center portion thereof;
a pair of cooling spaces formed on opposite sides of the arrangement space to be separated from the arrangement space and allow a refrigerant to flow therein, wherein the pair of cooling spaces includes a first cooling space and a second cooling space;
a cooling passage separated from the arrangement space and fluidically communicating first ends of the pair of cooling spaces with each other; and
a pair of through holes respectively fluidically-connecting second ends of the pair of cooling spaces to outside of the power inverter apparatus;
a first cooling plate coupled to the first cooling space to seal the first cooling space thereby;
a second cooling plate coupled to the second cooling space and provided with a pair of flow holes at opposite ends thereof through which the refrigerant flows to the outside or inside of the second cooling space;

a first power module contacting with an external side of the first cooling plate;

a second power module directly contacting with an external side of the second cooling plate;

an extrusion cooler mounted to directly contact with an external side of the second power module, the extrusion cooler having opposite ends thereof connected to the pair of flow holes, allowing the refrigerant to flow in from the second cooling space through one of the pair of flow holes, and allowing the refrigerant to flow into the second cooling space through a remaining one of the pair of flow holes; and a third power module mounted to contact with an external side of the extrusion cooler, wherein the pair of through holes includes:

an inlet hole fluidically connected to the first cooling space through which the refrigerant flows into the housing; and an outlet hole fluidically connected to the second cooling space through which the refrigerant flows out of the housing, and wherein the power inverter apparatus is configured to switch between a closed-end winding (CEW) method using the first power module, and an open-end winding (OEW) method using both the first power module and the second power module, according to operating of the third power module.

2. The power inverter apparatus of claim 1, wherein, in the extrusion cooler, a part of the refrigerant in the second cooling space flows by a pressure difference between the extrusion cooler and the second cooling space.

3. The power inverter apparatus of claim 1, wherein the first cooling plate and the second cooling plate respectively include cooling fins respectively extending toward the pair of cooling spaces.

4. The power inverter apparatus of claim 3, wherein a flow rate ratio of the second cooling space and the extrusion cooler is set according to a volume size of the cooling fins of the second cooling plate.

5. The power inverter apparatus of claim 1, further including:

a nipple connected to each of the pair of through holes to allow the refrigerant to flow in from the outside of the power inverter apparatus or flow out to the outside.

6. The power inverter apparatus of claim 1, further including:

a control board disposed on an upper portion of the housing and connected to the first power module, the second power module, and the third power module, to control operation of the first, second and third power modules.

7. The power inverter apparatus of claim 6, wherein the first power module is operated to generate a constant amount of heat, and wherein operations of the second power module and the third power module are controlled by the control board depending on a power inversion state, so that an amount of heat generated thereby is changed.

8. The power inverter apparatus of claim 6, wherein the housing includes an extension portion extending upwards from an upper surface of the housing and connected to the control board.

9. The power inverter apparatus of claim 8, further including:

a guide coupling the control board to the housing and insulating the control board.

10. The power inverter apparatus of claim 1, further including:

a pair of brackets respectively positioned between the first power module and the first cooling plate and between the second power module and the second cooling plate and coupling the first power module and the second power module to the housing.

11. The power inverter apparatus of claim 1, further including:

a first busbar coupled to an external side of the first power module to connect an external motor and the first power module to each other.

12. The power inverter apparatus of claim 11, further including:

a current sensor connected to the first busbar to measure a current that flows to the external motor.

13. The power inverter apparatus of claim 1, further including:

a second busbar provided at a lower portion of the housing, connected to the second power module, and connecting the second power module to an external motor.

14. The power inverter apparatus of claim 1, further including:

a pair of thermal pads respectively positioned at an external side of the first power module and an external side of the third power module to radiate heat from the first power module and the third power module.

15. The power inverter apparatus of claim 14, further including:

a pair of module covers respectively positioned at an external side of the pair of thermal pads to cover the pair of thermal pads, the first power module, the second power module, and the third power module.

* * * * *